United States Patent
Kataoka et al.

(10) Patent No.: US 12,283,834 B2
(45) Date of Patent: Apr. 22, 2025

(54) CHARGING DEVICE OF ELECTRIC TOOL TO REDUCE NOISE

(71) Applicant: Koki Holdings Co., Ltd., Tokyo (JP)

(72) Inventors: Mikihiro Kataoka, Ibaraki (JP); Naoto Ichihashi, Ibaraki (JP)

(73) Assignee: Koki Holdings Co., Ltd., Tokyo (JP)

( * ) Notice: Subject to any disclaimer, the term of this patent is extended or adjusted under 35 U.S.C. 154(b) by 514 days.

(21) Appl. No.: 17/431,429

(22) PCT Filed: Jan. 31, 2020

(86) PCT No.: PCT/JP2020/003666
§ 371 (c)(1),
(2) Date: Aug. 17, 2021

(87) PCT Pub. No.: WO2020/175010
PCT Pub. Date: Sep. 3, 2020

(65) Prior Publication Data
US 2022/0123569 A1    Apr. 21, 2022

(30) Foreign Application Priority Data

Feb. 28, 2019    (JP) .................................. 2019-036348

(51) Int. Cl.
*H02J 7/00* (2006.01)
*H01M 10/0525* (2010.01)
(Continued)

(52) U.S. Cl.
CPC ....... *H02J 7/0045* (2013.01); *H01M 10/0525* (2013.01); *H01M 10/46* (2013.01);
(Continued)

(58) Field of Classification Search
CPC ............... H02J 7/0045; H01M 10/613; H01M 10/6563; H01M 10/0525; H01M 10/46; H01M 50/244; H05K 7/20909
(Continued)

(56) References Cited

U.S. PATENT DOCUMENTS

2008/0290836 A1* 11/2008 Tsai .................... H05K 7/20136
361/695
2015/0084591 A1* 3/2015 Kishima ............... H02J 7/0013
320/112
(Continued)

FOREIGN PATENT DOCUMENTS

| CN | 102687336 | 9/2012 |
| CN | 104283257 | 1/2015 |

(Continued)

OTHER PUBLICATIONS

"Office Action of Japan Counterpart Application" with English translation thereof, issued on Mar. 15, 2022, p. 1-p. 12.
(Continued)

*Primary Examiner* — Nathaniel R Pelton
(74) *Attorney, Agent, or Firm* — JCIPRNET

(57) ABSTRACT

A charging device (1) includes: a case (4) to which a battery pack is detachably attached; a charging circuit portion that charges the battery pack; a fan (30) for cooling; a first opening portion (5) for intake; and a second opening portion (6) for exhaust. An air path from the fan (30) to the second opening portion (6) is connected by an air path forming portion (33) having a long and curved passage length. The air path forming portion (33) narrows down at a point in the middle to achieve a positional relationship in which the fan (30) cannot be seen from the second opening portion (6), thereby making it difficult for operating noise of the fan (30) to leak to the outside. The air path forming portion (33) is (Continued)

formed using a wall surface of the case (4), an outer air-guiding wall (34), and an inner air-guiding wall (35).

15 Claims, 10 Drawing Sheets

(51) Int. Cl.
  *H01M 10/46* (2006.01)
  *H01M 10/613* (2014.01)
  *H01M 10/6563* (2014.01)
  *H01M 50/244* (2021.01)
  *H05K 7/20* (2006.01)
(52) U.S. Cl.
  CPC ..... *H01M 10/613* (2015.04); *H01M 10/6563* (2015.04); *H01M 50/244* (2021.01); *H05K 7/20909* (2013.01)
(58) Field of Classification Search
  USPC .......................................................... 320/113
  See application file for complete search history.

(56) References Cited

U.S. PATENT DOCUMENTS

| | | | | |
|---|---|---|---|---|
| 2015/0244034 A1* | 8/2015 | Taga | ................. | H01M 10/6563 320/107 |
| 2018/0191183 A1* | 7/2018 | Namiki | .............. | H05K 7/20145 |
| 2018/0224909 A1 | 8/2018 | Koo et al. | | |
| 2018/0317348 A1* | 11/2018 | Taga | ..................... | H02J 7/0042 |
| 2020/0091572 A1* | 3/2020 | Yokote | ............... | H05K 7/20863 |

FOREIGN PATENT DOCUMENTS

| | | |
|---|---|---|
| CN | 104868522 | 8/2015 |
| CN | 108352715 | 7/2018 |
| CN | 109328422 | 2/2019 |
| EP | 2824795 | 1/2015 |
| JP | 2000215922 | 8/2000 |
| JP | 2005276733 | 10/2005 |
| JP | 3131105 | 4/2007 |
| JP | 2012074161 | 4/2012 |
| JP | 2013192282 | 9/2013 |
| JP | 2015019535 | 1/2015 |
| JP | 2015162930 | 9/2015 |
| JP | 2016149841 | 8/2016 |
| JP | 2018195492 | 12/2018 |
| WO | 2017002519 | 1/2017 |
| WO | 2017073112 | 5/2017 |
| WO | 2017208710 | 12/2017 |

OTHER PUBLICATIONS

"International Search Report (Form PCT/ISA/210) of PCT/JP2020/003666," mailed on Mar. 24, 2020, with English translation thereof, pp. 1-6.

"Search Report of Europe Counterpart Application", issued on May 16, 2022, p. 1-p. 8.

"Office Action of China Counterpart Application", issued on Oct. 26, 2023, with English translation thereof, pp. 1-23.

* cited by examiner

CHARGING DEVICE OF ELECTRIC TOOL TO REDUCE NOISE

CROSS-REFERENCE TO RELATED APPLICATION

This application is a 371 application of the International PCT application serial no. PCT/JP2020/003666, filed on Jan. 31, 2020, which claims the priority benefits of Japan Patent Application No. 2019-036348, filed on Feb. 28, 2019. The entirety of each of the above-mentioned patent applications is hereby incorporated by reference herein and made a part of this specification.

BACKGROUND

Technical Field

The present invention relates to a charging device of a battery pack used for an electric tool, and particularly to a charging device that reduces noise.

Related Art

In a conventional charging device, in order to cope with an increase in the capacity of a secondary battery in a battery pack, charging current has been increased to secure capacity and shorten charging time. However, because a large current flows through a charging circuit in the charging device and the secondary battery in the battery pack when the charging current is increased, the temperature of the charging circuit and the secondary battery rises sharply, which may lead to deterioration or failure of the secondary battery or failure of an element forming the charging circuit. In order to solve this problem, a charging device is known in which a cooling fan for generating cooling air is arranged in a charging device so as to cool a heat generating element of a charging circuit and a secondary battery in a battery pack during charging. Patent literature 1 discloses a charging device in which the drive mode of a cooling fan can be changed and the noise of the cooling fan can be reduced by selecting an off mode or a low noise mode. In addition, Patent literature 2 discloses a charging device in which both a battery pack and a charging circuit can be cooled by one cooling fan.

LITERATURE OF RELATED ART

Patent Literature

Patent literature 1: Japanese Patent Laid-Open No. 2005-276733
Patent literature 1: Japanese Patent Laid-Open No. 2015-19535

SUMMARY

Problems to be Solved

In the conventional charging device, the cooling fan is arranged near a wall surface of a charging device case, and an opening portion (for example, exhaust port) of the cooling air is arranged adjacent to the cooling fan. If the distance from the opening portion (for example, the exhaust port) to the cooling fan is short, a thin rod may reach the fan when it is inserted. Therefore, the opening portion being the exhaust port has a two-stage structure with alternating columns so that foreign matter such as thin rods does not easily reach the cooling fan. The structure of the conventional opening portion is described with reference to FIG. 10.

FIG. 10 is a diagram showing the cross-sectional shape of a fan 330 for cooling and opening portions 306 for exhaust of a conventional charging device 301. In the conventional charging device 301, the fan 330 is arranged near the right side wall of the charging device case 302, air is sucked from the space on the left side and passed through the fan 330, and the exhaust of the fan 330 is directly discharged to the outside in a linear direction. The opening portion 306 being the exhaust port is formed in a slit shape being long and thin in the vertical direction, and seven slits are formed here. Parallel wall portions 308 are arranged on the inner side of right side walls 307 of the charging device case 302, and vertically thin and long slits are formed on the wall portions 308. Furthermore, the columnar portion of the wall portion 308 and the columnar portion of the right side wall 307 of the charging device case 302 are prevented from overlapping in the exhaust direction. Therefore, a thin rod is not brought into contact with the fan 330 even if the thin rod is inserted straight from the right side wall of the charging device case 302 in a direction perpendicular to the wall surface, and thus the possibility of foreign matter getting inside can be reduced. However, when the column portion of the slit of the opening portion has a two-stage structure, it is difficult to secure a sufficient opening area in a limited region 311 and the exhaust flow is not discharged linearly but is discharged while bending as shown by black arrows in the diagram, thus leading to a decrease in air volume. Furthermore, when the fan 330 and the opening portions 306 are close to each other, the noise of the fan 330 is prone to leak directly to the outside from the opening portions 306, which causes a loud operating noise of the charging device 301.

In order to solve the problem of noise, according to Patent literature 1, the operating noise can be suppressed by reducing the rotation speed of the cooling fan. However, while the noise is reduced, the cooling performance is degraded, and thus a charging device designed to ensure a sufficient maximum amount of cooling air is required. In Patent literature 2, only the battery pack and the charging circuit can be cooled, and no consideration is given to reducing the operating noise generated by the cooling fan.

The present invention has been made in view of the above background, and an object of the present invention is to provide a charging device that reduces noise. In addition, another object of the present invention is to provide a charging device that can improve air volume and cooling performance of a cooling fan. In addition, still another object of the present invention is to provide a charging device having a structure in which foreign matter does not easily enter a cooling fan from an opening portion.

Means to Solve Problems

The typical features of the invention disclosed in the present application are described as follows. According to one feature of the present invention, there is provided a charging device that includes: a case to which a battery pack is detachably attached; a charging circuit portion accommodated in the case so as to charge the battery pack; a fan generate cooling air for cooling the charging circuit portion; an opening portion formed in a wall portion of the case so as to exhaust the cooling air; and an air path forming portion extending from a downstream side of the fan to the opening portion and forming, between the fan and the opening portion, a cooling air path through which the cooling air passes. The charging device is configured that a wall portion of the air path forming portion is located on a virtual straight line that connects an outer edge portion of the case forming the opening portion and an end portion of the fan on a side close to the opening portion. In addition, the cooling air path is arranged on a lateral side or an upper side of a board on which the charging circuit portion is mounted. Besides, there is provided a charging device that the air path forming portion has a guide portion that extends in a lateral direction intersecting an exhaust direction of the fan so as to prevent flow to a direction opposite to the lateral direction, and a duct portion that guides the cooling air guided by the guide portion to the exhaust port without passing through the battery pack.

According to another feature of the present invention, when the case of the charging device is divided into four equal parts by a left-right center line and a front-rear center line when viewed from above, the opening portion (exhaust port) is located in one region of the four equal parts, and a part or all of the fan is located in a region different from the opening portion (exhaust port). In addition, when the case is divided into four equal parts by a left-right center line and a front-rear center line when viewed from above, more than half of the fan is located in one region of the four equal parts, and the opening portion (exhaust port) is located in a region different from the region in which more than half of the fan is located. The air path forming portion has a guide portion that extends in a lateral direction intersecting an exhaust direction of the fan so as to prevent flow to a direction opposite to the lateral direction, and a duct portion that guides the cooling air guided by the guide portion to the opening portion (exhaust port) without passing through the battery pack. In addition, the cooling air path has a first region arranged on the fan side and a second region that is continuous with the first region and is arranged on the opening portion (exhaust port) side, and a maximum width of a horizontal cross-sectional area of the second region in a flow direction is larger than a maximum width of the first region.

According to still another feature of the present invention, the charging device includes a battery pack connection portion for mounting the battery pack on an upper surface of the case, and the fan and the cooling air path are located below the battery pack connection portion. A maximum height H of the cooling air path in an up-down direction is larger than a maximum width L2-L4 in a left-right direction. The case has a circuit arrangement region in which the charging circuit portion is arranged and an air path arrangement region in which the cooling air path is arranged separately from the circuit arrangement region.

According to a further feature of the present invention, the charging device has a fan located on a downstream side of the charging circuit portion so as to generate cooling air for cooling the charging circuit portion, and an opening portion (exhaust port) that is formed in the case apart from the battery pack connection portion and exhausts the cooling air to the outside of the case. An air path forming portion is arranged which connects an exhaust side of the fan and the opening portion (exhaust port) of the charging device to form a cooling air path through which the cooling air passes without passing through the battery pack. The opening portion (exhaust port) is arranged on a side surface of the case of the charging device, and the air path forming portion is arranged along the inner side surface of the case. The case includes a lower case for accommodating the charging circuit portion and an upper case fixed to the lower case on an upper side of the lower case, and the air path forming portion is formed by the upper case and the lower case. In addition, the fan is sandwiched between the upper case and the lower case. The case includes a second opening portion facing the opening of the battery pack in a state that the battery pack is mounted in the case. The fan generates cooling air for cooling the battery pack via the opening portion and generates cooling air for cooling the charging circuit portion.

Effect

According to the present invention, it is possible to provide a charging device that can reduce noise. In addition, it is possible to provide a charging device that can improve air volume and cooling performance of a cooling fan. Furthermore, it is possible to provide a charging device having a structure in which foreign matter does not easily enter the cooling fan from the opening portion. Besides, because the length of the duct portion is increased, the fan can be arranged at a position apart from the opening portion (exhaust port), and the noise of the fan can be sufficiently attenuated before being transmitted to the outside of the case. Additionally, the air path forming portion is curved so that a thin rod is prevented from abutting against a rotating portion of the fan even if the thin rod is inserted into the fan from the second opening portion. Therefore, the quality in terms of safety can be maintained without making the slit structure of the opening portion into two stages. In addition, because the slit structure of the opening portion is not two stages but one stage, the area of the second opening portion can be secured, and the air volume and the cooling performance can be improved. Besides, because the second opening portion is formed apart from the battery pack connection portion, the second opening portion is not blocked by the battery pack, and a decrease in air volume can thus be suppressed. Furthermore, because the second opening portion is formed on the side surface, foreign matter such as rainwater does not easily enter the case from the second opening portion.

DESCRIPTION OF THE EMBODIMENTS

Embodiment 1

Hereinafter, embodiments of the present invention are described with reference to the drawings. In the following diagrams, the same parts are designated by the same reference signs, and the repeated description is omitted. In addition, in the present specification, the directions of front, rear, left, right, up and down are described as the directions shown in the diagrams.

Figure 1:
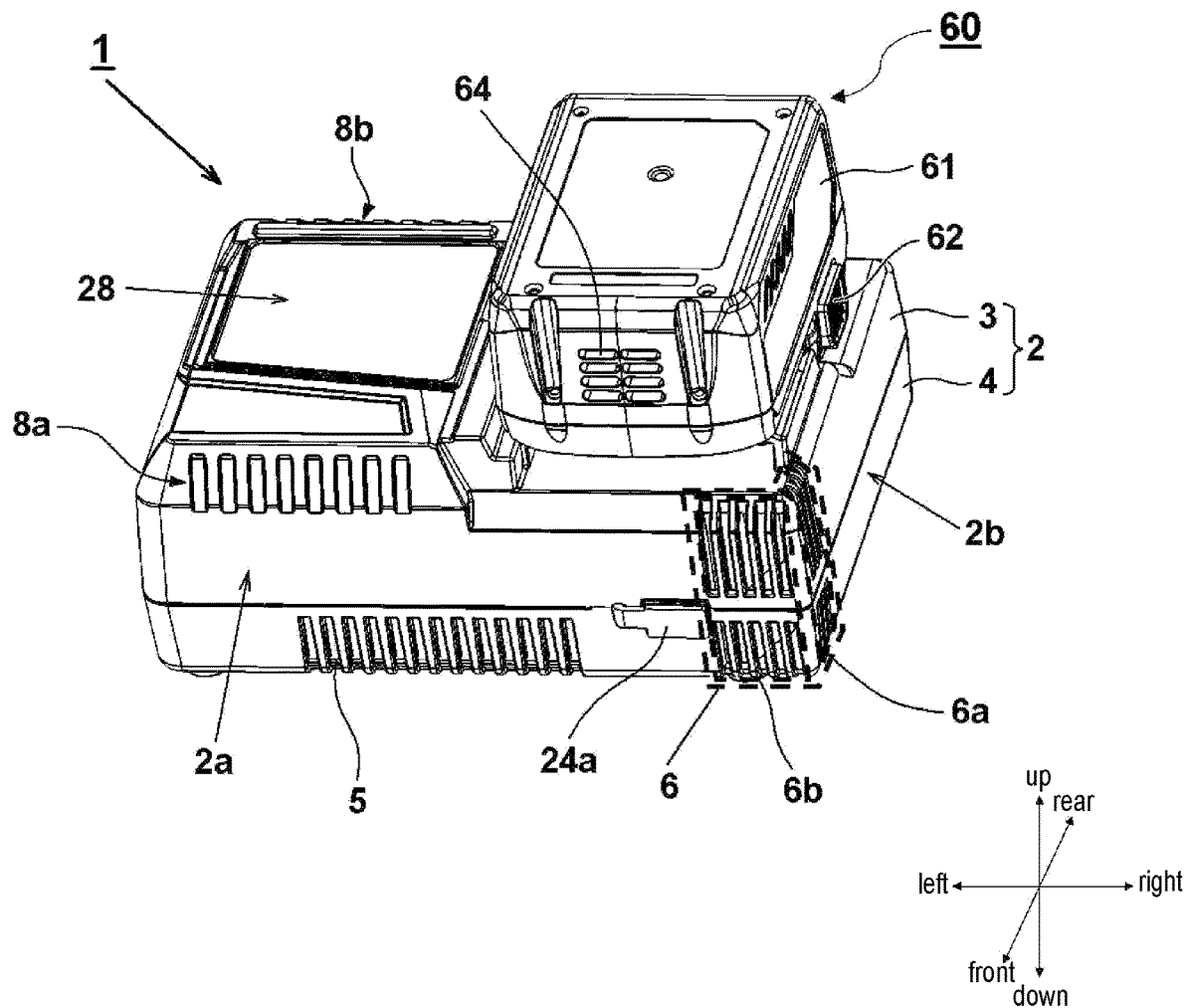
FIG. 1 is a perspective view of a charging device 1 according to an embodiment of the present invention and shows a state in which a battery pack is mounted.

A charging device 1 is a device for charging, using a commercial power supply, a battery pack 60 which is removed from an electric device such as an electric tool. A charging device case 2 being the housing of the charging device 1 has an upper case 3 (upper housing) and a lower case 4 (lower housing), and is formed into a substantially rectangular parallelepiped shape being long in the left-right direction. The upper case 3 and the lower case 4 are formed by injection molding using a heat-resistant resin material having electric insulation. Moreover, in the specification, the direction between the upper case 3 and the lower case 4 in FIG. 1 is defined as the up-down direction, the longitudinal direction of the upper case 3 and the lower case 4 is defined as the left-right direction, and the direction orthogonal to these directions is defined as the front-rear direction.

The upper case 3 forms the upper half of the charging device case 2, and on the upper surface of the upper case 3, a battery pack connection portion 10 (see FIG. 2) is arranged in the right side region, and a display portion 28 is arranged in the left side region. A battery capacity lamp, a charging status indicator lamp, a temperature abnormality warning lamp, a power supply switch for a USB output terminal of the battery pack 60, and the like are arranged on the display portion 28. At the corners of the display portion 28 in the front-rear direction, slit-like recess groups 8a and 8b are formed from the front surface to the upper surface and from the rear surface to the upper surface. These recess groups 8a and 8b are arranged from the viewpoint of strength improvement and design, and are not through holes for communicating air inside and outside the upper case 3. A first opening portion 5 is formed in the vicinity of the lower center of a front side wall surface 2a of the charging device case 2, and a second opening portion 6 is formed from the vicinity of the right corner of the front side wall surface 2a to the vicinity of the front corner of a right side wall surface 2b. One of the first opening portion 5 and the second opening portion 6 is used as an intake port and the other is used as an exhaust port. In the embodiment, the first opening portion 5 is used as the intake port and the second opening portion 6 is used as the exhaust port. Vice versa, the second opening portion 6 may be located on the suction side.

The first opening portion 5 is an elongated hole extending in the up-down direction across the bottom surface from the front side surface of the lower case 4. A plurality (13) of the first opening portions 5 are formed side by side in the left-right so as to take outside air into the charging device case 2. The first opening portion 5 is formed using only the lower case 4, but the second opening portion 6 is arranged using both the upper case 3 and the lower case 4. An upper portion of the second opening portion 6 being a cooling air outlet is formed at the right front corner of the upper case 3. The upper portion of the second opening portion 6 is a slit-shaped opening that is formed during injection molding of the upper case 3 and is thin and long in the up-down direction, and a plurality of openings are arranged.

The lower case 4 forms the lower half of the charging device case 2. The first opening portion 5 is formed by a plurality of slits being thin and long in the vertical direction, and the lower portion of the second opening portion 6 is formed at a position where the lower portion is aligned with the upper portion in the left-right and the front-rear direction. As can be understood from FIG. 1, the first opening portion 5 being the intake port is widened in the lateral direction so as to secure a certain degree of opening area, and the second opening portion 6 is arranged in the vertical direction to thereby efficiently utilize the side wall portion from the bottom surface of the inner space of the charging device case 2 to the ceiling surface.

The battery pack 60 includes a battery pack case 61, a secondary battery (not shown) accommodated in the battery pack case 61, and a battery side terminal portion (not shown) that is connected to the secondary battery and connected to a connection terminal portion of the charging device 1. The secondary battery (not shown) accommodated in the battery pack case 61 is charged by connecting the battery pack 60 to the charging device 1. The type of the secondary battery is arbitrary, and for example, when a lithium ion battery is used, the output voltage is 14.4 V for 4 cells, 18 V for 5 cells, and 36 V for 10 cells for example.

The battery pack case 61 has a substantially rectangular parallelepiped shape, and a suction port 64 for taking the outside air into the battery pack case 61 is formed on the front surface. In addition, a connection terminal portion (not shown in the diagram) is arranged on the upper surface (lower side in FIG. 1, because it is mounted on the charging device 1 in an inverted state) of the battery pack case 61. A discharge port (corresponding to the opening of the battery pack and not shown in the diagram) for discharging the outside air taken in from the suction port 64 is formed on the upper surface of the battery pack case 61.

Figure 2:
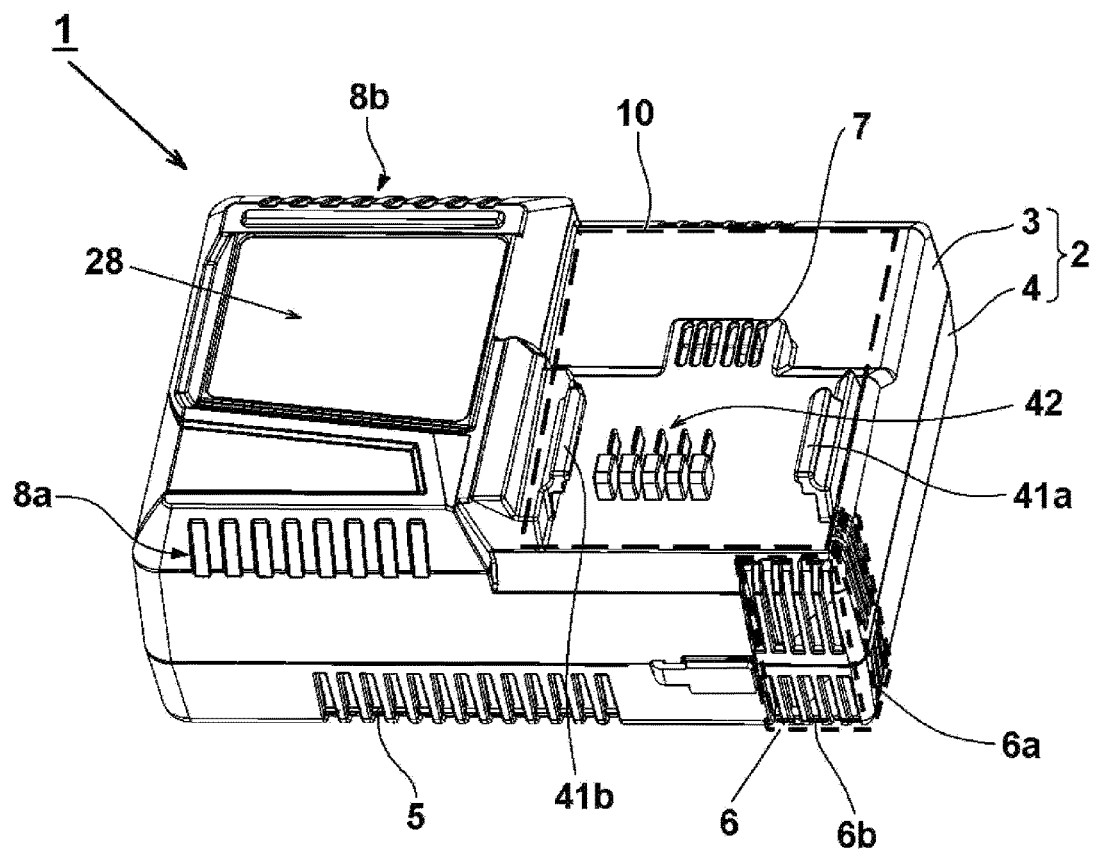
FIG. 2 is a perspective view of the charging device 1 of the embodiment and shows a state in which a battery pack is not mounted.
Figure 2:
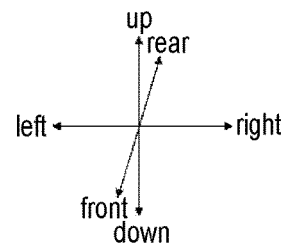

FIG. 2 is a perspective view of a state that the battery pack 60 is removed from the state of FIG. 1. The battery pack connection portion 10 is arranged on the upper right side of the upper case 3, at which the battery pack 60 can be mounted. A third opening portion 7 (connection-portion opening portion) being a sucking port for sucking air from the battery pack 60 side via the discharge port (not shown) of the battery pack 60 is formed in the vicinity of the center in the battery pack connection portion 10. The third opening portion 7 is a slit-shaped elongated hole extending in the front-rear direction, and six holes are formed side by side in the left-right direction. The shape of the third opening portion 7 substantially matches the shape of the exhaust port (not shown) formed on the battery pack 60 side. Rail portions 41a and 41b extending in parallel in the front-rear direction are formed on the left and right sides of the battery pack connection portion 10. A connection terminal portion 42 connected to the battery side terminal of the battery pack 60 is arranged on a portion sandwiched between the rail portions 41a and 41b. The battery pack 60 can be mounted as shown in the state of FIG. 1 by sliding it horizontally from the rear to the front side in the inverted state. When the battery pack 60 is connected to the battery pack connection portion 10, the third opening portion 7 gets a position relationship to close to and face the discharge port (not shown) of the battery pack 60. Therefore, sucking air from the third opening portion 7 has the same effect as sucking air from the inside of the battery pack 60. As for the removal of the battery pack 60 from the charging device 1, the battery pack 60 can be removed from the battery pack connection portion 10 while pressing latch buttons 62 on the left and right sides (see FIG. 1) from the mounted state shown in FIG. 1, or the battery pack 60 can be removed from the battery pack connection portion 10 by sliding the battery pack 60 horizontally backwards without pressing the latch buttons 62.

When the battery pack 60 and the charging device 1 are connected at the battery pack connecting portion 10, the connection terminal portion 42 fits with the battery side terminal (not shown) of the battery pack 60, and thus the battery pack 60 is electrically connected to the charging device 1. The connection terminal portion 42 is provided with five terminals, that is, a positive terminal for charging, a negative terminal, a LD terminal, a T terminal, and a LS terminal. Moreover, signal terminals other than the above terminals may also be arranged in the connection terminal portion 42, and the connection terminal portion 42 may be appropriately set according to the battery pack 60 to be connected.

The rail portions 41a and 41b are arranged on the left side and the right side of the connection terminal portion 42 so as to extend in the front-rear direction, respectively, and when the battery pack 60 and the charging device 1 are connected at the battery pack connection portion 10, the battery side terminal of the battery pack 60 is guided to be connected to the connection terminal portion 42 of the charging device 1 by sliding the slide groove (not shown) of the battery pack 60 along the rail portions 41a and 41b. In addition, after the connection is made, the battery pack 60 is stably held by the slide groove and the rail portions 41a and 41b.

Figure 3:
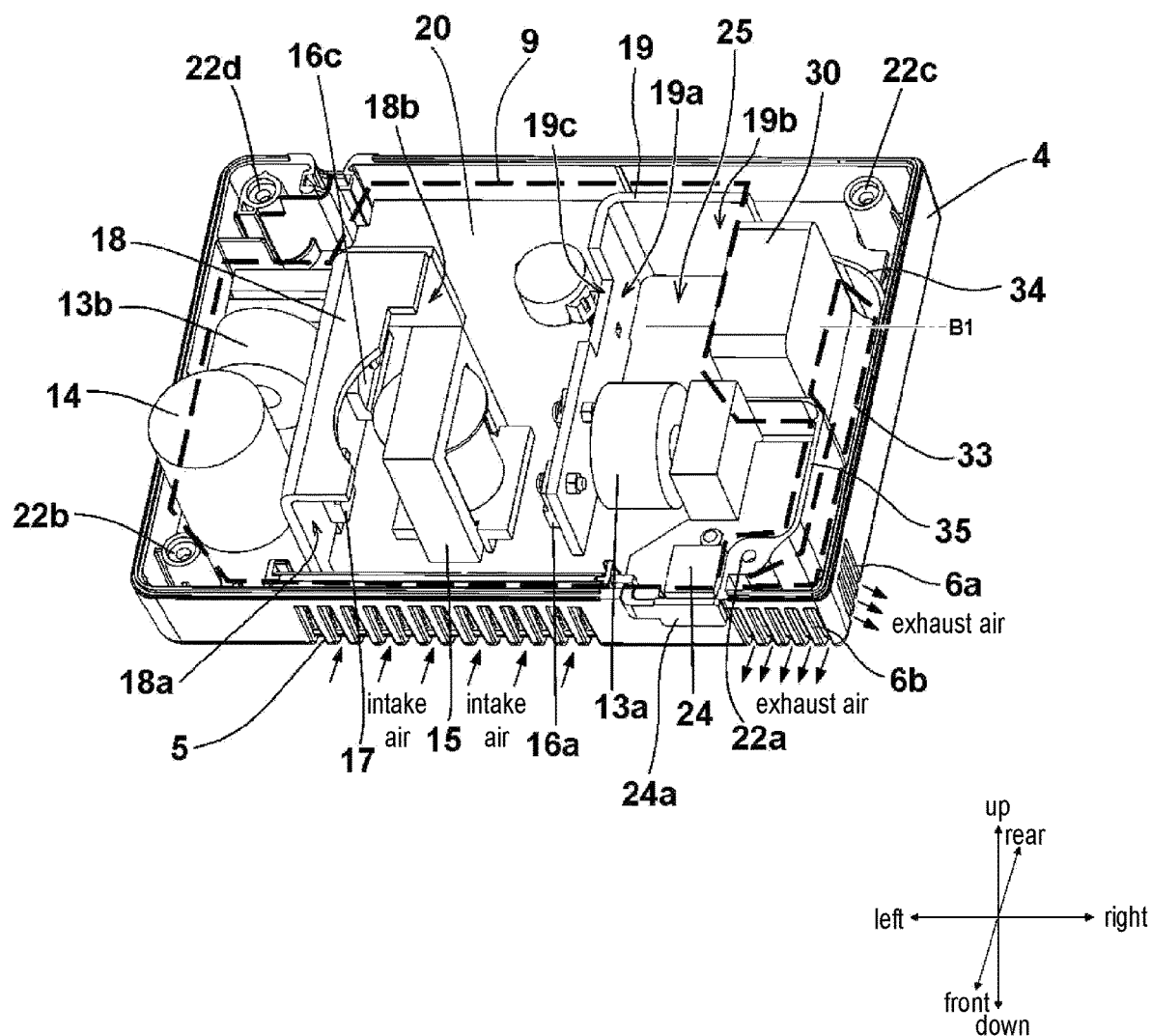
FIG. 3 is a perspective view of the charging device 1 of FIG. 1 with an upper case removed.

FIG. 3 is a perspective view of the charging device 1 with a state that the upper case 3 is removed. The upper case 3 and the lower case 4 are fixed by a plurality of screws after an electric element, a cooling fan, and the like are accommodated inside. The lower case 4 forms the lower half of the charging device case 2, and the first opening portion 5 for sucking outside air and the lower portion of the second opening portion 6 (6a, 6b) are formed on the side wall portion of the lower case 4. The first opening portion 5 and the second opening portion 6 are formed during molding of synthetic resin, and screw bosses 22a to 22d having through holes that allows the screws to pass therethrough from the downward direction are formed in the vicinity of the four corners of the lower case 4. A USB socket 24 is arranged between the left side of the second opening portion 6 of the lower case 4 and the first opening portion 5, and a rubber cap 24a that can be opened and closed is arranged at the mounting port of the USB socket 24.

Most of the charging circuit portion constituting the charging device 1 is mounted on a circuit board 20. The circuit board 20 is a single-layer or multi-layer printed circuit board which is fixed to the lower case 4 by a plurality of screws (not shown) after various electronic elements are fixed by soldering or the like. Choke coils 13a and 13b, a condenser 14, a transformer 15, three diodes 16a to 16c, a FET (field effect transistor) 17, and the like are mounted on the circuit board 20. The heat dissipating portion on the back surface of the diode 16c and the heat dissipating portion on the back surface of the FET 17 are fixed so as to be in contact with a cooling fin 18 made of aluminum, and high heat dissipation is maintained by the cooling fin 18. In addition, the heat dissipating portion on the back surface of the diode 16a and the heat dissipating portion on the back surface of the diode 16b are also fixed to another cooling fin 19. In addition to the cooling function, the cooling fins 18 and 19 function as a guide portion for guiding the cooling air flowing through the charging circuit portion to a predetermined direction, that is, to the suction side of a fan 30. The choke coil 13b and the condenser 14 are arranged on the left side of the cooling fin 18. Here, elements that generates a large amount of heat (for example, the diodes 16a to 16c, the FET17, and the transformer 15) are arranged at a position that is in the vicinity of the first opening portion 5 and is directly exposed to the cooling air path surrounded by the two cooling fins 18 and 19. Another choke coil 13a is arranged on the right front side of the cooling fin 19.

The fan 30 for cooling is arranged on the right side of the rear portion of the cooling fin 19. In the diagram, the fan 30 is schematically shown by a square box. The fan 30 may be, for example, a widely commercially available DC fan or cooling fan. The fan 30 is sandwiched between the upper case 3 and the lower case 4. The fan 30 is used for extending the service life of the electronic element by cooling the heat generated by an electronic device with air and dissipating the heat. The fan 30 is accommodated in a flat rectangular parallelepiped case made of synthetic resin, and one surface side of the fan 30 in the axial direction is the suction side and the opposite surface side is the exhaust side. Here, the fan 30 is arranged in a manner that the left side of the fan 30 in the direction of an axis B1 is the suction side (upstream side) and the right side is the exhaust side (downstream side). The air that has flowed into the charging device case 2 through the first opening portion 5 passes through the air path forming portion 33 after passing through the fan 30, and then is discharged to the outside of the charging device case 2 via the second opening portion 6.

The air path forming portion 33, which is an exhaust air passage extending from the downstream side of the fan 30 to the second opening portion 6 formed on the wall portion of the case 2, is formed on the downstream side of the fan 30. The space of the air path forming portion 33 below a dividing horizontal plane is an air passage (air path) extending to the second opening portion 6, which is defined by an outer air-guiding wall 34, the inner wall surface and the bottom surface of the lower case 4, and an inner air-guiding wall 35. The upper space (not shown) of the air path forming portion 33 is formed on the inner side of the upper case 3 (see FIG. 2). The shape of the upper space is the same as the horizontal cross-section shape of the charging device case 2, and wall portions corresponding to the outer air-guiding wall 34 and the inner air-guiding wall 35 are formed in the upper case 3. The bottom surface of the air path forming portion 33 is defined by the lower case 4, and the ceiling surface is defined by the upper case 3. Screw bosses (not shown) protruding downward are formed at the four corners of the upper case 3 on the lower surface side. The screw bosses (not shown) are formed integrally with the upper case 3. Female screw holes corresponding to the screw bosses 22a to 22d having through holes in the lower case 4 are formed, and the upper case 3 and the lower case 4 are screwed together by using the screws (not shown). Moreover, the method of fixing the upper case 3 and the lower case 4 is arbitrary, and a method using a known fixing member for fixing may be adopted in addition to the method using screws.

The outside air sucked from the first opening portion 5 in the arrow direction mainly flows between the cooling fin 18 and the cooling fin 19, and the flow is bent about 90 degrees from the suction direction by a back wall surface 18b of the cooling fin 18 and flows toward a notch portion 19c of the cooling fin 19. The air that has passed through the notch portion 19c flows into a front chamber 25 of the fan 30. The cooling fin 19 is an aluminum plate bent in an L shape, and has a left wall surface 19a and a back wall surface 19b. The upper ends of the cooling fins 18 and 19 have a size that allows the upper ends to extend to a position that is in contact or close to the ceiling surface of the upper case 3. The cooling fins 18 and 19 are fixed to the circuit board 20 by using a resin such as silicon while being placed on the circuit board 20, respectively.

A connection line (not shown) for electrical connection with the battery pack 60 is connected to the circuit board 20. When charging the battery pack 60, the circuit board 20 charges the battery pack 60 safely and quickly by adjusting and controlling the charging current, the charging voltage, and the like according to a predetermined condition. Moreover, although not shown here, a microcomputer is mounted on the circuit board 20. The microcomputer is configured to highly control the charging operation of the battery pack 60, for example, to monitor the temperature of the battery cell and adjust the charging current according to the temperature of the battery cell.

Figure 4:
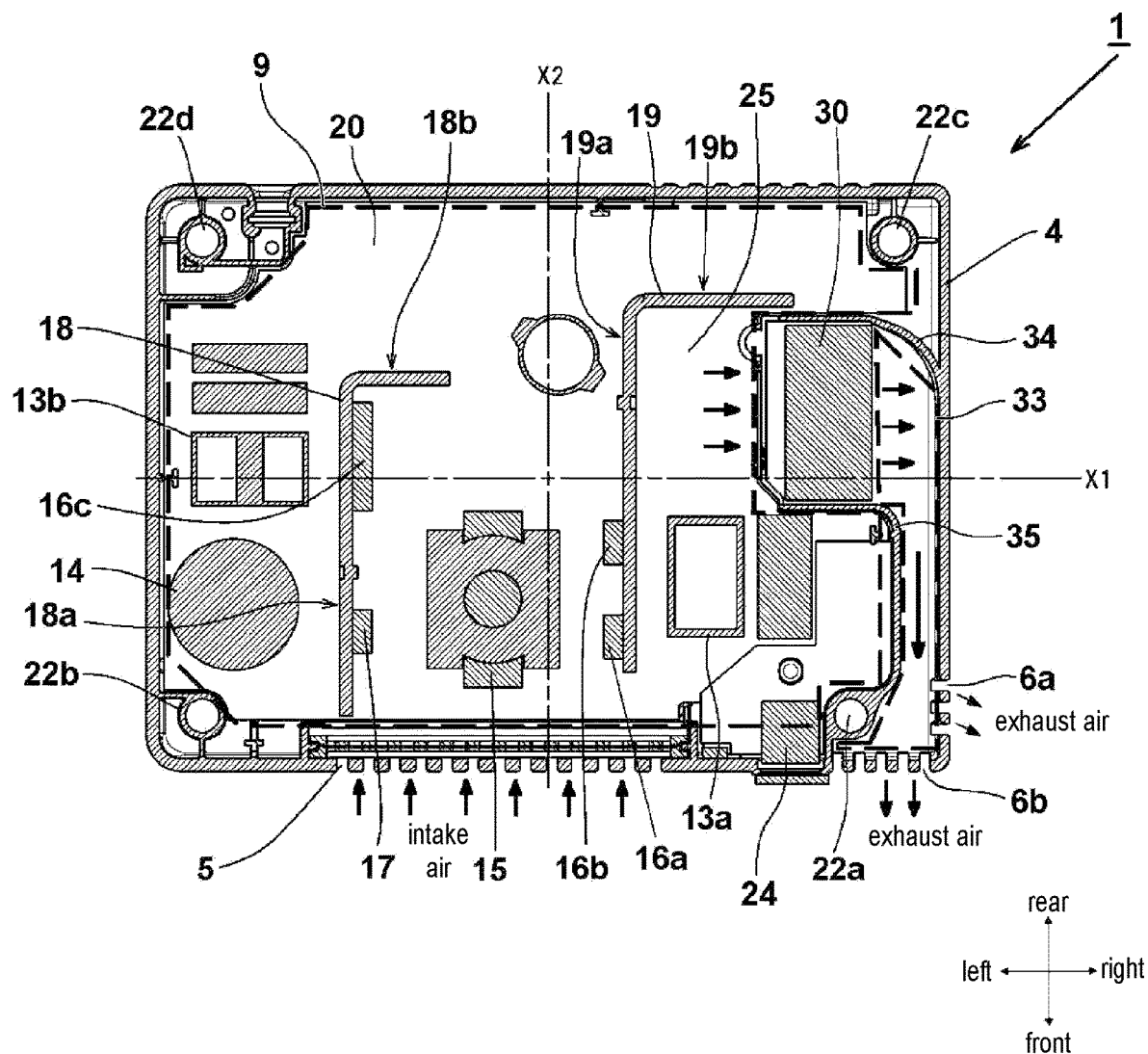
FIG. 4 is a horizontal cross-sectional view of the charging device 1 of FIG. 1.

FIG. 4 is a horizontal cross-sectional view of the charging device 1 of FIG. 1. Here, a center line X1 in the front-rear direction and a center line X2 in the left-right direction are shown when the charging device case 2 is viewed from above. When the charging device case 2 is divided into four equal parts by the center line X1 and the center line X2 to define four regions, the second opening portion 6 being the exhaust port for the cooling air is located in one region (lower right region) of the four equal parts, and at least half or all of the fan 30 is located in a region (upper right region) in which the axis B1 of the fan 30 is located in a region different from the exhaust port. The cooling air that passed through the fan 30 from the front chamber 25 of the fan 30 in the arrow direction flows forward through a portion of the air path forming portion 33 having a narrow width in the left-right direction, and a part of the exhausted cooling air is discharged to the right side from a right side surface 6a of the second opening portion, and the rest is discharged to the front side from a front side surface 6b of the second opening portion.

Figure 5:
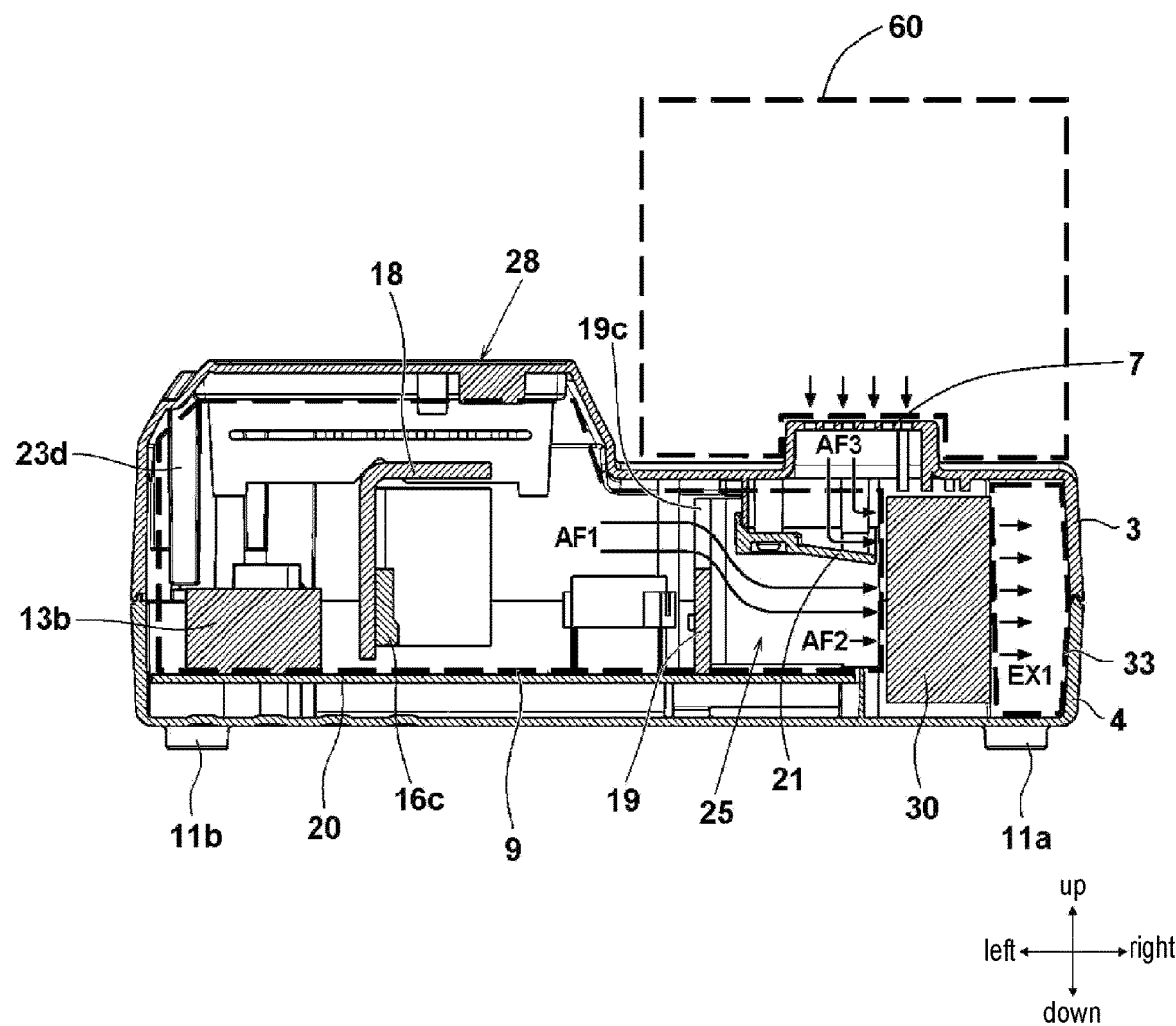
FIG. 5 is a vertical cross-sectional view of the charging device 1 of FIG. 1.

FIG. 5 is a vertical cross-sectional view of the charging device 1 of FIG. 1 passing the axis B1 of the fan 30. The fan 30 has a maximum diameter that makes it possible to be accommodated by fully utilizing the space from the bottom surface to the ceiling surface in the internal space below the battery pack connection portion 10 of the charging device case 2. The circuit board 20 is held in a state of floating from the bottom surface of the lower case 4 by ribs that are arranged so as to extend upward from the bottom surface of the lower case 4, and a cooling chamber 9 through which the cooling air flows is the upper space of the circuit board 20. Legs 11a to 11d (11c and 11d are not shown in the diagram) are formed at the four corners of the bottom surface of the lower case 4, and when the charging device 1 is mounted, the bottom surface of the lower case 4 is configured to be separated from the mounting surface by a predetermined distance. In addition, the fan 30 and the cooling air path (air path forming portion 33) are arranged below the battery pack connection portion 10. An increase in size of the charging device 1 can be suppressed by optimally arranging the fan 30 and the cooling air path.

The air passing through the fan 30 flows from the inside of the front chamber 25 on the left side to the air path forming portion 33 side on the right side. In addition to cooling air AF1 flowing into the front chamber 25 being the inlet side space of the fan 30 through the notch portion 19c of the cooling fin 19, cooling air AF2 also flows into the front chamber 25 through the right side portion of the cooling fin 19. In addition, cooling air AF3 flowing from the discharge port of the battery pack 60 through the third opening portion 7 is guided by a duct 21 and flows into the fan 30. That is, the air (cooling air AF1, AF2), which is sucked from the first opening portion 5 and flows into the fan 30 via the front chamber 25, and the cooling air AF3, which comes from the inside of the battery pack 60 and flows into the fan 30 from the third opening portion 7 via the duct 21, are sucked into the fan 30. Because the duct 21 is located on the upper side of the circuit board 20 when the upper case 3 is fixed to the lower case 4, a battery cooling air path (AF3) and a circuit cooling air path (AF1, AF2) are independent of each other. Thus, the first opening portion 5 (see FIG. 2) and the third opening portion 7 serve as inlets for the intake air to the charging device 1. The cooling air AF1 to AF3 sucked to the fan 30 are mixed (merged) in the fan 30 and discharged as exhaust air EX1 on the air path forming portion 33 side.

During charging of the battery pack 60, the outside air taken into the internal space of the battery pack 60 from the suction port 64 reaches the discharge port (not shown) of the battery pack 60, then passes through the discharge port and the third opening portion 7 (see FIG. 2) and is sucked into the charging device case 2. In the process from the suction port 64 (see FIG. 1) of the battery pack 60 reaching the discharge port, the secondary battery, the circuit elements, and the like inside the battery pack case 61 are cooled. The discharge port (not shown) of the battery pack case 61 is positioned adjacent to the third opening portion 7 (see FIG. 2) of the charging device 1 when the battery pack 60 is mounted on the charging device 1, and the air inside the battery pack case 61 is sucked into the charging device case 2 by the cooling fan on the charging device 1 side.

Figure 6:
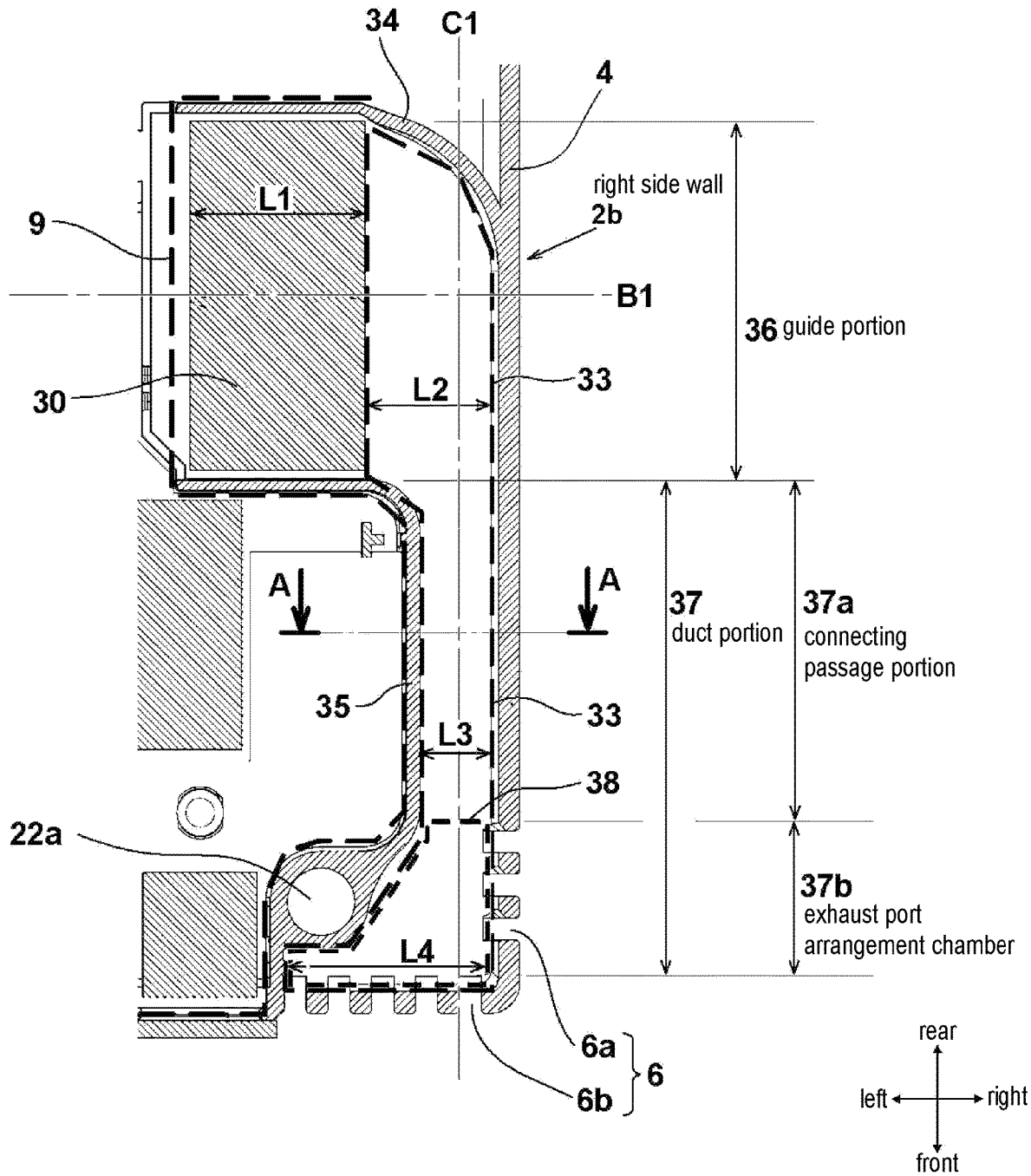
FIG. 6 is a partially enlarged view showing a horizontal cross section of the charging device 1 of FIG. 4 in the vicinity of an air path forming portion 33.

FIG. 6 is a partially enlarged view showing a horizontal cross section of the charging device 1 of FIG. 4 in the vicinity of the air path forming portion 33. The position of this horizontal 1 cross section is near the dividing surface of the upper case 3 and the lower case 4. The air flowing through the air path forming portion 33 is separated by the inner air-guiding wall 35 so as not to be mixed with the air flowing through the cooling chamber 9. The air path forming portion 33 is a space being thin and long in the vertical direction (front-rear direction), which connects the exhaust side of the fan 30 and the second opening portion 6 being the exhaust port, and forms a cooling air path through which cooling air passes without passing through the battery pack 60. Thus, because a distance L2 occupied by the air path forming portion 33 is shorter than a length L1 of the fan 30 in the axial direction, the configuration of the present invention can be realized without sacrificing much space as compared with a configuration in which the fan 30 is arranged adjacent to the right side wall surface 2b. The inner air-guiding wall 35 is a U-shaped wall in a top view from the front side surface of the fan 30, and is joined to the screw boss 22a on the front side so as to reach the front side wall portion of the lower case 4. That is, the air on a space (cooling chamber 9) side where the choke coil 13a and the USB socket 24 are arranged cannot flow to the air path forming portion 33 side unless it passes through the fan 30.

Figure 10:
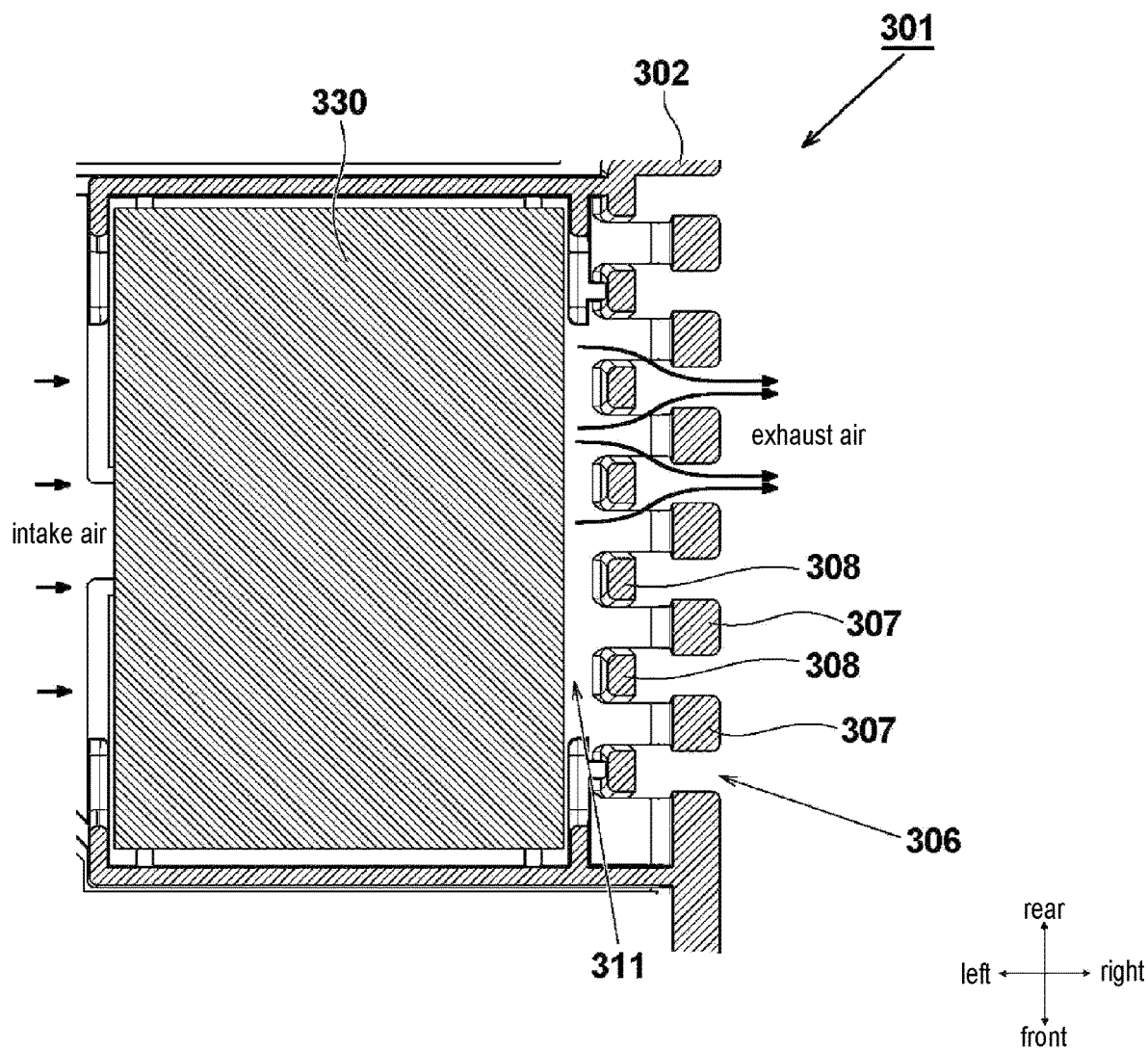
FIG. 10 is a partial horizontal cross-sectional view of a charging device 301 of a conventional embodiment in the vicinity of the opening portion.

The air path forming portion 33 is formed by a guide portion 36 which is located within a projection range of the fan 30 when viewed in the direction of the axis B1 and a duct portion 37 continuous from the guide portion 36 in a manner of extending in a direction orthogonal to the axis B1. The fan 30 is arranged at a distance L2 from the right side wall surface 2b of the lower case 4. Here, assuming that the length of the fan 30 in the direction of the axis B1 is L1, the relationship of L2≤L1 is established. The reason for ensuring the distance L2 of the guide portion 36 in this way is that the air passage is bent 90 degrees when viewed from above. The duct portion 37 is an air passage extending toward the second opening portion 6. A connecting passage portion 37a of the duct portion 37 that is adjacent to the guide portion 36 is a portion where a width L3 in the left-right direction is narrower than the width L2. On the other hand, a height H3 (described later in FIG. 7) utilize the entire from the ceiling surface of the upper case 3 to the bottom surface of the lower case 4, and thus the connecting passage portion 37a can secure a sufficient cross-sectional area although it is thin and long in the up-down direction. Because a part of the charging circuit can be arranged on the left side of the inner air-guiding wall 35 which is formed in a U shape when viewed from above, a decrease in the effective utilization area of the circuit board 20 can be suppressed. Thus, by narrowing the width of the connecting passage portion 37a in the left-right direction, transmission of the noise generated by the fan 30 to the outside via the second opening portion 6 can be effectively suppressed. In the embodiment, compared with the length from the fan 330 to the exhaust port of the conventional charging device shown in FIG. 10, a sufficient flow path length can be secured by arranging the fan 30 sufficiently separated from the second opening portion 6 in the flow path. Therefore, transmission of the noise generated by the fan 30 to the outside via the second opening portion 6 can be effectively suppressed.

An exhaust port arrangement chamber 37b that contacts the portion with the second opening portion 6 formed therein is formed on the downstream side of the connecting passage portion 37a of the air path forming portion 33. The exhaust port arrangement chamber 37b is a space in which a slit-shaped discharge port (the second opening portion 6) is arranged on the wall surface of the charging device case 2. The screw boss 22a is offset slightly to the left side from an ideal arrangement position to secure space 38 in the exhaust port arrangement chamber 37b. The right side surface 6a of the second opening portion 6 is formed on the right side surface portion of the charging device case 2, and the front side surface 6b of the second opening portion 6 is formed on the front side surface portion of the charging device case 2. Three slits being long and thin in the vertical direction are formed on the right side surface 6a of the second opening portion 6. In addition, four slits being long and thin in the vertical direction (up-down direction) are formed on the front side surface 6b of the second opening portion 6. In the exhaust port arrangement chamber 37b, the cooling air flowing in the direction of an axis C1 is discharged to the outside through the slit-shaped opening. A predetermined space 38 is secured as the exhaust port arrangement chamber 37b in order to effectively disperse and discharge the cooling air to each slit portion of the second opening portion 6 and reduce exhaust resistance. The maximum width L4 of the space 38 when viewed in the left-right direction is larger than the width L3 of the connecting passage portion 37a and the width L2 of the guide portion 36. The cooling air path defined by the air path forming portion 33 has a first region (the guide portion 36) arranged on the fan 30 side and a second region (the duct portion 37) that is continuous with the first region and is arranged on the exhaust port (the second opening portion 6) side, and the maximum width L4 of the flow direction cross-sectional area of the duct portion 37 being the second region is larger than the maximum width L2 of the first region.

The air discharged from the fan 30 flows in the guide portion 36 in a direction parallel to the direction of the axis B1. However, in the duct portion 37, the cooling air flows in parallel with the center line C1. Therefore, the air discharged from the fan 30 is directed to the flow path direction (direction of the axis C1) of the duct portion 37 by arranging the outer air-guiding wall 34 on the outer peripheral side of the flow path of the guide portion 36 in the bending direction and bending the shape of the outer air-guiding wall 34. The portion (the connection passage portion 37a) of the duct portion 37 where the left-right width is narrowed down has a front-rear length approximately the same as or longer than the diameter of the opening (not shown) of the fan 30 on the exhaust side. Thus, by ensuring a certain length of the connecting passage portion 37a of the duct portion 37 in the direction of the axis C1, leakage of the operating noise of the fan 30 from the second opening portion 6 to the outside can be suppressed. In addition, by arranging not only the guide portion 36 but also the duct portion 37, intrusion of foreign matter from the second opening portion 6 to the fan 30 can be suppressed. In particular, a part of the fan 30 cannot be seen directly through the right side surface 6a of the second opening portion 6 and the front side surface 6b of the second opening portion 6, and thus no matter in which direction a thin rod that can pass through the slit-shaped opening of the second opening portion 6 is inserted straight from the second opening portion 6, the thin rod hits against one of the wall portions (the inner air-guiding wall 35, the outer air-guiding wall 34, or the inner wall of the charging device case 2) and does not reach the fan 30. That is, no matter how many virtual straight lines that connects the outer edge portion of the charging device case 2 forming the opening portion and the end portion of the fan 30 on a side close to the opening are drawn, the wall portion of the air path forming portion 33 is located on all virtual straight lines.

Figure 7:
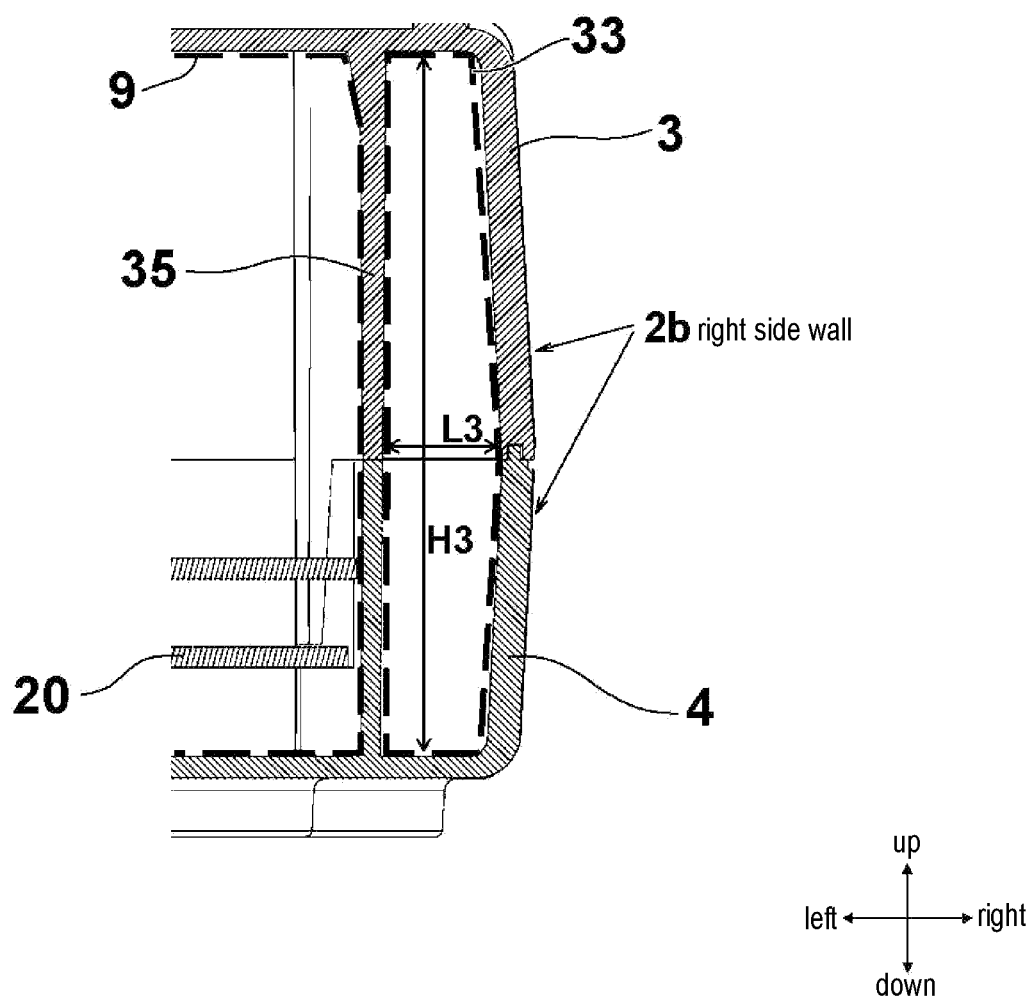
FIG. 7 is a vertical cross-sectional view of the A-A portion of the charging device 1 of FIG. 6.

FIG. 7 is a vertical cross-sectional view of the A-A portion of the charging device 1 of FIG. 6. As can be understood from the cross-sectional view of FIG. 7, the inner air-guiding wall 35 is formed by combining an upper portion extending from the upper case 3 to the dividing surface in the downward direction and a lower side portion extending from the lower case 4 to the dividing surface in the upward direction. Thus, the inner air-guiding wall 35 is formed so as to extend in the same direction as the dividing direction (up-down direction) at the time of injection molding of the upper case 3 and the lower case 4, and the upper case 3 and the lower case 4 can be manufactured by the same manufacturing process as before. That is, the outer edge of the air path forming portion 33 is defined by the upper case 3 and the right side wall surface 2a, the ceiling surface and the bottom surface of the lower case 4. In addition, a portion of the air path forming portion 33 extends further below the circuit board 20. The air path forming portion 33 is arranged on the lateral side of the circuit board 20 (right side of the circuit board 20 in FIG. 7), and extends from the upper side to the lower side of the circuit board 20 in the up-down direction. On the other hand, the air path forming portion 33 is not arranged in the region directly below the circuit board 20 (the region between the circuit board 20 and the bottom surface of the lower case 4 in the up-down direction). That is, as is clear from FIGS. 4 and 5, the region in which the circuit board 20 is arranged (the circuit arrangement region shown by the broken line of the cooling chamber 9 in FIG. 4) and the region in which the air path forming portion 33 is arranged (air passage arrangement region) are deviated from each other in the left-right direction and do not overlap in the up-down direction. Accordingly, the dimensions in the up-down direction can be suppressed. Although the connecting passage portion 37a of the air path forming portion 33 is formed in a manner that the width L3 is narrower (thinner) than the widths L2 and L4 shown in FIG. 6, the height H3 in the up-down direction is secured at maximum, and thus cooling air can be effectively exhausted without increasing the exhaust resistance.

As described above, in the embodiment, because the air path forming portion 33 is arranged on the downstream side of the fan 30, and the length of the air passage of the air path forming portion 33 is increased, noise can be suppressed. The leakage of the driving noise of the fan 30 to the outside of the charging device case 2 can be greatly suppressed, and as result, the operating noise of the fan 30 of the charging device 1 can be reduced through the second opening portion 6. Furthermore, because the width of the intermediate portion of the air path forming portion 33 is narrowed down, the leakage of the driving noise of the fan 30 to the outside of the charging device case 2 can be further suppressed, and as a result, the operating noise of the fan 30 of the charging device 1 can be reduced through the second opening portion 6.

The operating noise of the fan 30 that is transmitted to the outside through the first opening portion 5 on the suction side is not zero. As shown is FIG. 4, when the charging device 1 is divided into four equal parts, the first opening portion 5 is mainly arranged in the lower left region and extends to the lower right region. However, because the lower left region and the lower right region are separate from the main arrangement region of the fan 30 (the upper right region), and the length of the intake flow path is sufficiently longer than the exhaust flow path, the noise of the fan 30 leaking from the suction side to the outside through the first opening portion 5 is sufficiently small. In addition, a wall portion having an L-shape when viewed from above is formed on the suction side of the fan 30 by the cooling fin 19 made of aluminum, and thus the transmission of the operating noise from the fan through the first opening portion 5 is further reduced.

Embodiment 2

Figure 8:
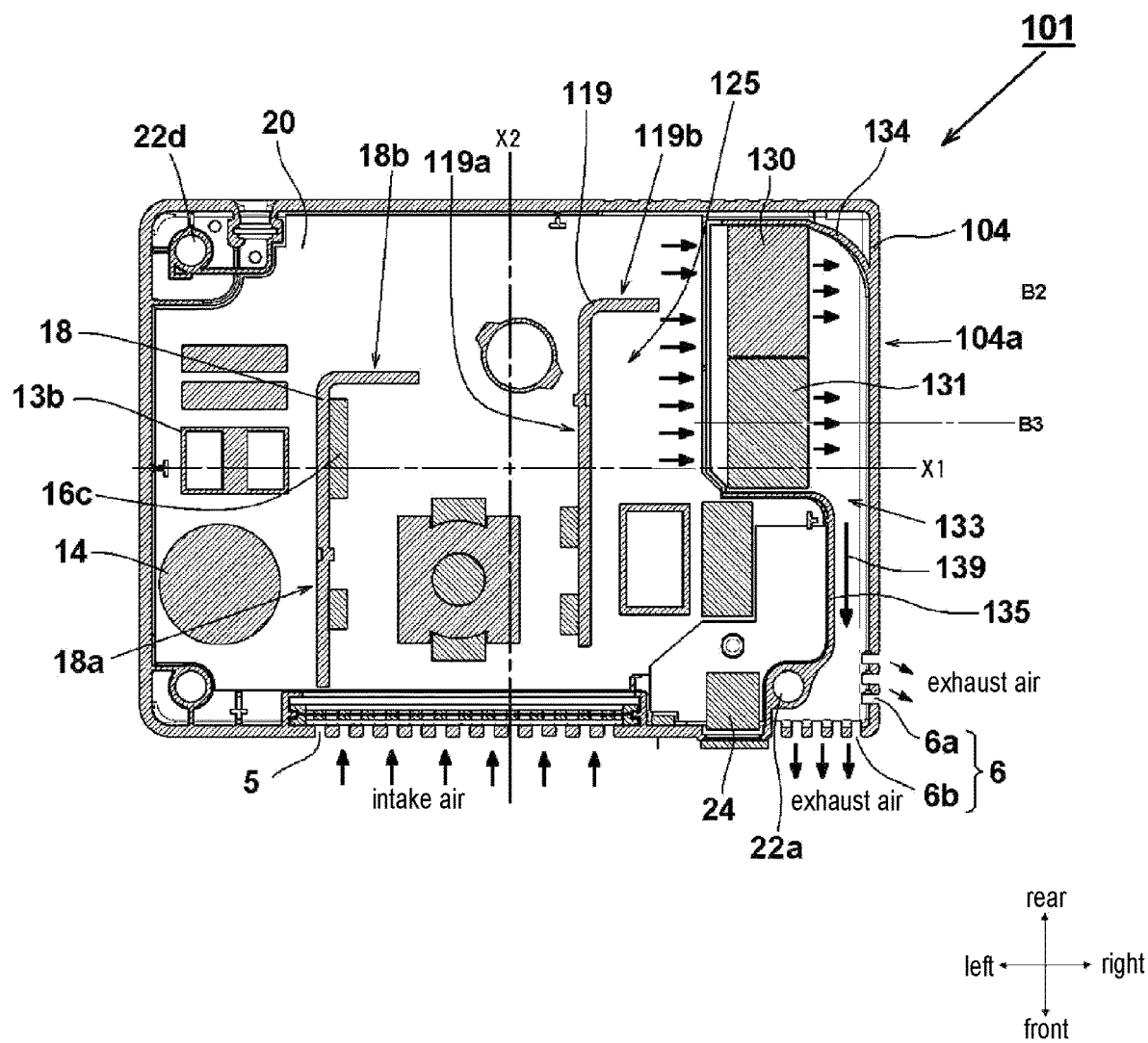
FIG. 8 is a horizontal cross-sectional view of a charging device 101 according to a second embodiment of the present invention.

FIG. 8 is a horizontal cross-sectional view of a charging device 101 according to a second embodiment of the present invention. In the second embodiment, two fans 130 and 131 are arranged side by side in the lateral direction (front-rear direction) so as to increase the air volume within a limited height range. The intake direction of the fan 130 is from left to right as shown by the arrow in the diagram, and the exhaust direction is the direction of an axis B2 on the right side of the fan 130. Similarly, the intake direction of the fan 131 is from left to right as shown by the arrow, and the exhaust direction is the direction of an axis B3 on the right side of the fan 131. The exhaust air discharged from the fans 130 and 131 is guided to an outer air-guiding wall 134 and a right side wall 104a of a lower case 104 and flows forward the inside of the air path forming portion 133 in the direction of an arrow 139, and then is discharged to the outside through the second opening portion 6 in the front right corner of the charging device case 102. Here, most of the two fans 130 and 131 are included in the back right space of the charging device case 102. A portion of the fan 131 protrudes slightly closer to the front side than the center line X1, but the portion where the cooling air is discharged is approximately behind the center line X1. Thus, the exhaust air flowing through the air path forming portion 133 in the direction of the arrow 139 flows through more than half of the front-rear length of the charging device case 102, and a sufficient duct length is secured before the exhaust air is discharged to the charging device case 102. Therefore, the transmission of noise to the outside along with the rotation of the fans 130 and 131 can be significantly suppressed.

A part of the air path forming portion 133 of an upper case 103 has an internal shape substantially similar to the shape of the lower case 104, and defines the space of the upper half of the air path forming portion 133. In the upper case 103, the air flowing from the discharge port of the battery pack 60 through the third opening portion 7 flows into a front chamber 125 on the suction side of the fan 131, and is mainly sucked by the fan 131. On the other hand, most of the air on the fan 130 side flows from the left side to the right side on the back side of a back wall surface 119b of a cooling fin 119 that is bent in an L shape, and mainly flows into the fan 130. The arrangement in the internal space of the charging device 101 that is closer to the left side than the center line X2 is the same as that of the charging device 1 of the first embodiment. On the other hand, the cooling fin 119 is configured in a manner that the left-right length of the back wall surface 119b is formed shorter than that of the cooling fin 19 of the first embodiment, and air flows toward the fan 130 on the back side of the back wall surface 119b.

Embodiment 3

Figure 9:
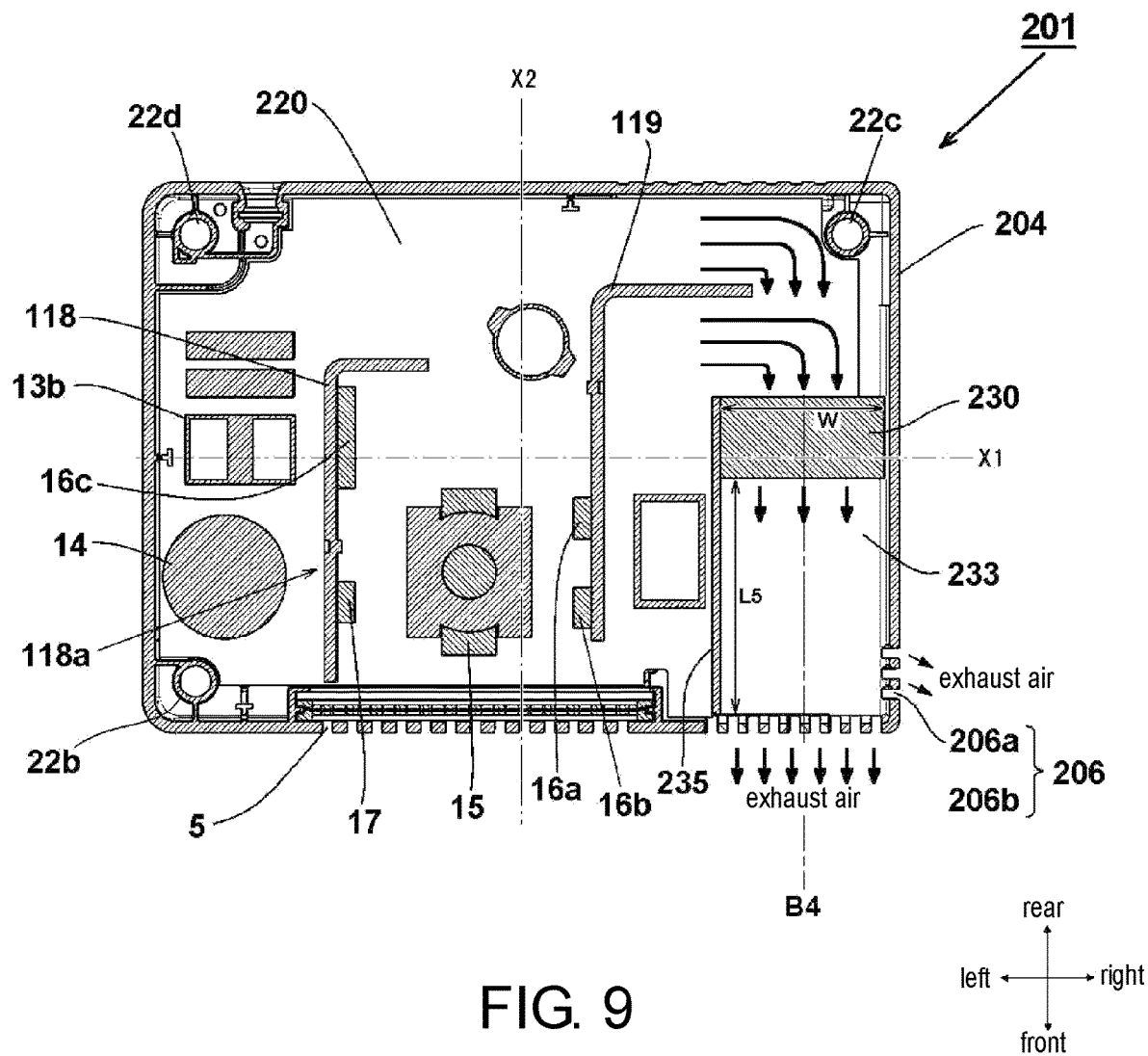
FIG. 9 is a horizontal cross-sectional view of a charging device 201 according to a third embodiment of the present invention.

FIG. 9 is a horizontal cross-sectional view of a charging device 201 according to a third embodiment of the present invention. One fan 230 is used in the charging device 201, and an axis B4 of the fan 230 is oriented forward. In addition, an air path forming portion 233 has the same width W as the fan 230 in the left-right direction so as to secure an air path forming portion 233 having a length L5. The right side of the air path forming portion 233 is defined by the right side wall of an upper case 203 and the right side wall of a lower case 204, and the left side is defined by an inner air-guiding wall 235 integrally formed with the upper case 203 and the lower case 204. The upper side of the air path forming portion 233 is defined by the upper wall surface of the upper case 203 (not shown), and the lower side of the air path forming portion 233 is defined by the upper wall surface of the lower case 204 (not shown).

In order to secure a large air path forming portion 233, it is necessary to reduce the size of the circuit board 220 to promote integration. In addition, when the charging device is divided into four equal parts by the center lines X1 and X2, the fan 230 is arranged in a manner that the center point thereof is included in the back right region, and the second opening portion 206 being the exhaust port is arranged in the lower right region. Thus, if a large air path forming portion 233 can be secured, and the length L5 can be secured to almost half of the depth (front-rear length) of the charging device case 2, the distance to the second opening portion 206 being the exhaust port can be increased without increasing the flow path resistance, and exhaust noise transmitted to the outside can thus be greatly suppressed as compared with the conventional charging device.

Although the present invention has been described above based on the embodiments, the present invention is not limited to the above-mentioned embodiments, and various modifications can be made without departing from the spirit of the present invention. For example, the arrangement of the fan 30 and the air path forming portion 33 of the charging device is not limited to the arrangement as in the above embodiments, and any arrangement structure may be adopted as long as the distance from the fan 30 to the exhaust port can be sufficiently secured by the air path forming portion 33. When the charging device is divided into four equal parts by the center lines X1 and X2, the second opening portion and most of the fan may be arranged in the same region (for example, the front right region). At that time, the distance of the air passage can be secured by changing the air direction at the outer air-guiding walls 34 and 134 as in the first and second embodiments. Alternatively, the straight air passage as in the third embodiment may be arranged along the longitudinal direction (left-right direction) of the charging device, and the region including the fan is different from the region in which the exhaust port is formed. These configurations may also ensure a sufficient distance from the fan to the exhaust port as compared with the configuration of the conventional example shown in FIG. 10. Moreover, when the charging device is divided into four equal parts by the center lines X1 and X2, the entire part of the second opening portion 6 (exhaust port) is configured to be formed in the same region, but like the first opening portion 5, the second opening portion 6 may also be formed across two regions.

What is claimed is:

1. A charging device comprising:
    a case to which a battery pack is detachably attached, the case extending in a first dimension along a first direction, a second dimension along a second direction, and a third dimension along a third direction, wherein the first direction, the second direction and the third direction are orthogonal to each other;
    a charging circuit portion accommodated in the case so as to charge the battery pack;
    at least one fan accommodated in the case so as to generate cooling air for cooling the charging circuit portion;
    a first opening portion formed in a first wall portion of the case so as to take in an outside air;
    a second opening portion formed in a second wall portion of the case so as to exhaust the cooling air; and
    an air path forming portion extending substantially horizontally from a downstream side of the at least one fan to the second opening portion in a state when the charging device is placed on a surface, and forming a cooling air path between the at least one fan and the second opening portion through which the cooling air passes,
    wherein when viewed along a shortest dimension of the case among the first dimension, the second dimension and the third dimension, the case is divided into four regions by a left-right center line and a front-rear center line, more than half of each one of the at least one fan is located in a region different from the first opening portion and the second opening portion.

2. The charging device according to claim 1, wherein a wall portion of the air path forming portion is located on a virtual straight line that connects an outer edge portion of the case forming the second opening portion and an end portion of the at least one fan on a side close to the second opening portion.

3. The charging device according to claim 1, wherein the cooling air path is arranged on a lateral side or an upper side of a circuit board on which the charging circuit portion is mounted.

4. The charging device according to claim 1, wherein the at least one fan is arranged on a downstream side of the charging circuit portion, and
    the air path forming portion has a guide portion that extends in a lateral direction intersecting an exhaust direction of the at least one fan so as to prevent flow to a direction opposite to the lateral direction, and a duct portion that guides the cooling air guided by the guide portion to the second opening portion without passing through the battery pack.

5. The charging device according to claim 1, wherein the at least one fan is arranged on a downstream side of the charging circuit portion, and
    the second opening portion is located in one region of the four regions, the first opening portion is mainly located in a region different from the second opening portion, and a part or all of the at least one fan is located in a region different from the first opening portion and the second opening portion.

6. The charging device according to claim 1, wherein the at least one fan is arranged on a downstream side of the charging circuit portion, and
    more than half of the at least one fan is located in one region of the four regions, the first opening portion is mainly located in a region different from the region in which more than half of the at least one fan is located, and the second opening portion is located in a region different from the regions in which more than half of the at least one fan is located and in which the first opening portion is mainly located.

7. The charging device according to claim 1, wherein the cooling air path has a first region arranged on the at least one fan side and a second region that is continuous with the first region and is arranged on the second opening portion side, and a maximum width of a cross-sectional area of the second region in a flow direction is larger than a maximum width of the first region.

8. The charging device according to claim 1, comprising a battery pack connection portion for mounting the battery pack on an upper surface of the case, wherein the at least one fan and the cooling air path are located below the battery pack connection portion.

9. The charging device according to claim 1, wherein a maximum height of the cooling air path in an up-down direction is larger than a maximum width in a left-right direction.

10. The charging device according to claim 1, wherein the case has a circuit arrangement region in which the charging circuit portion is arranged and an air path arrangement region in which the cooling air path is arranged separately from the circuit arrangement region.

11. The charging device according to claim 1, wherein the case has a battery pack connection portion to which the battery pack is detachably attached,
    the at least one fan is arranged on a downstream side of the charging circuit portion,
    the second opening portion is an exhaust port that is formed in the case apart from the battery pack connection portion and exhausts the cooling air to the outside of the case, and
    the air path forming portion connects an exhaust side of the at least one fan and the exhaust port to form a cooling air path through which the cooling air passes without passing through the battery pack.

12. The charging device according to claim 11, wherein the exhaust port is arranged on a side surface of the case.

13. The charging device according to claim 11, wherein the air path forming portion is arranged along a side surface of the case.

14. The charging device according to claim 1,
wherein the case comprises a lower case for accommodating the charging circuit portion and an upper case fixed to the lower case on an upper side of the lower case, and
the air path forming portion is formed by the upper case and the lower case.

15. The charging device according to claim 1, wherein the case comprises a battery pack connection portion to which the battery pack is detachably attached, and a connection-portion opening portion facing the opening of the battery pack in a state that the battery pack is mounted at the battery pack connection portion, and
the at least one fan generates cooling air for cooling the battery pack via the connection-portion opening portion and generates cooling air for cooling the charging circuit portion.

\* \* \* \* \*